United States Patent
Policandriotes

(10) Patent No.: US 11,639,545 B2
(45) Date of Patent: *May 2, 2023

(54) METHODS FOR CHEMICAL VAPOR INFILTRATION AND DENSIFICATION OF POROUS SUBSTRATES

(71) Applicant: GOODRICH CORPORATION, Charlotte, NC (US)

(72) Inventor: Tod Policandriotes, Suffield, CT (US)

(73) Assignee: Goodrich Corporation, Charlotte, NC (US)

(*) Notice: Subject to any disclaimer, the term of this patent is extended or adjusted under 35 U.S.C. 154(b) by 396 days.

This patent is subject to a terminal disclaimer.

(21) Appl. No.: 16/843,605

(22) Filed: Apr. 8, 2020

(65) Prior Publication Data

US 2020/0232092 A1    Jul. 23, 2020

Related U.S. Application Data

(60) Division of application No. 15/725,620, filed on Oct. 5, 2017, now Pat. No. 10,648,075, which is a
(Continued)

(51) Int. Cl.
*C23C 16/26* (2006.01)
*C23C 16/04* (2006.01)
(Continued)

(52) U.S. Cl.
CPC ............ *C23C 16/045* (2013.01); *C04B 35/83* (2013.01); *C23C 16/26* (2013.01);
(Continued)

(58) Field of Classification Search
CPC ....... C23C 16/26; C23C 16/48; C23C 16/455; C23C 16/44; C23C 16/04

See application file for complete search history.

(56) References Cited

U.S. PATENT DOCUMENTS

| 2,867,508 A | 1/1959 | Wood |
| 3,091,517 A | 5/1963 | Short |

(Continued)

FOREIGN PATENT DOCUMENTS

| EP | 0480581 |   | 4/1992 |   |
| FR | 2854168 | * | 4/2003 | ............. C23C 16/44 |

(Continued)

OTHER PUBLICATIONS

Hoffman, Wesley, "In Situ Rapid Densification with Low-Viscosity Impregnant Reduces Processing Time to Produce Uniform Density Carbon-Carbon Composites". MRS Bulletin, Jun. 2002, p. 437.*

(Continued)

*Primary Examiner* — Bret P Chen
(74) *Attorney, Agent, or Firm* — Snell & Wilmer L.L.P.

(57) ABSTRACT

A method of chemical vapor infiltration and deposition includes disposing a porous substrate within a reaction chamber, establishing a sub-atmospheric pressure within the reaction chamber, introducing a hydrocarbon reaction gas into a reaction zone of the reaction chamber to densify the porous substrate, withdrawing unreacted hydrocarbon reaction gas from the reaction chamber, the unreacted hydrocarbon reaction gas comprising hydrocarbon molecules having six or more carbon atoms, removing at least a portion of the hydrocarbon molecules having six or more carbon molecules from the unreacted hydrocarbon reaction gas by causing the portion of the hydrocarbon molecules having six or more carbon atoms to condense, and recirculating at least a portion of the unreacted hydrocarbon reaction gas back into the reaction zone.

7 Claims, 7 Drawing Sheets

Related U.S. Application Data continuation-in-part of application No. 15/078,882, filed on Mar. 23, 2016, now Pat. No. 9,938,618.

(60) Provisional application No. 62/137,214, filed on Mar. 23, 2015.

(51) Int. Cl.

| | |
|---|---|
| *F25B 9/12* | (2006.01) |
| *C04B 35/83* | (2006.01) |
| *C23C 16/44* | (2006.01) |
| *C23C 16/455* | (2006.01) |
| *B23K 9/10* | (2006.01) |

(52) U.S. Cl.
CPC .... *C23C 16/4412* (2013.01); *C23C 16/45593* (2013.01); *F25B 9/12* (2013.01); *B23K 9/10* (2013.01); *C04B 2235/614* (2013.01)

(56) References Cited

U.S. PATENT DOCUMENTS

| | | | |
|---|---|---|---|
| 4,435,376 A | 3/1984 | Porter | |
| 4,472,454 A * | 9/1984 | Houdayer | F16D 69/023 427/591 |
| 5,006,132 A | 4/1991 | DiMartino, Sr. | |
| 5,083,560 A * | 1/1992 | Tillery, Jr. | A61B 5/097 128/207.14 |
| 5,348,774 A | 9/1994 | Galecki | |
| 5,789,026 A * | 8/1998 | Delperier | C23C 16/26 427/249.2 |
| 5,904,957 A * | 5/1999 | Christin | C23C 16/455 427/255.12 |
| 5,916,633 A * | 6/1999 | Lackey | C04B 35/83 427/249.4 |
| 6,015,465 A | 1/2000 | Kholodenko | |
| 6,051,071 A | 4/2000 | Charvet | |
| 6,083,560 A * | 7/2000 | Fisher | C04B 35/83 427/249.2 |
| 6,309,702 B1 * | 10/2001 | Suplinskas | C23C 16/26 427/249.2 |
| 6,342,171 B1 | 1/2002 | Murdie | |
| 6,410,088 B1 * | 6/2002 | Robin-Brosse | C23C 16/045 427/249.4 |
| 6,432,538 B1 | 8/2002 | Hiraoka | |
| 6,849,105 B2 | 2/2005 | Baudry | |
| 6,863,019 B2 | 3/2005 | Shamouilian et al. | |
| 8,057,855 B1 * | 11/2011 | Rudolph | C23C 16/26 427/249.1 |
| 8,163,088 B2 * | 4/2012 | Lamouroux | C23C 16/045 156/345.33 |
| 9,938,618 B2 * | 4/2018 | Policandriotes | C04B 35/83 |
| 2001/0019752 A1 | 9/2001 | Purdy | |
| 2002/0002903 A1 | 1/2002 | Noack | |
| 2002/0031655 A1 | 3/2002 | Suplinskas | |
| 2002/0076491 A1 * | 6/2002 | Delperier | C23C 16/26 427/248.1 |
| 2002/0094306 A1 | 7/2002 | Hara | |
| 2003/0036272 A1 | 2/2003 | Shamouilian | |
| 2003/0101869 A1 * | 6/2003 | Baudry | B01D 53/1487 96/275 |
| 2003/0118728 A1 * | 6/2003 | Sion | C04B 35/83 118/724 |
| 2003/0205203 A1 * | 11/2003 | Sion | C23C 16/045 118/724 |
| 2004/0009113 A1 | 1/2004 | Sion | |
| 2004/0071877 A1 | 4/2004 | Goujard | |
| 2004/0250775 A1 | 12/2004 | Sakai | |
| 2004/0255854 A1 | 12/2004 | Sakai | |
| 2005/0163929 A1 | 7/2005 | Delperier | |
| 2006/0151912 A1 | 7/2006 | Bauer | |
| 2006/0169404 A1 | 8/2006 | Herakles | |
| 2006/0197053 A1 | 9/2006 | Shiflett | |
| 2006/0263525 A1 * | 11/2006 | Sion | C23C 16/26 427/249.2 |
| 2007/0019708 A1 | 1/2007 | Shiflett | |
| 2007/0099038 A1 | 5/2007 | Galloway | |
| 2007/0184179 A1 | 8/2007 | Waghray | |
| 2008/0152803 A1 * | 6/2008 | Lamouroux | C23C 16/4587 118/724 |
| 2008/0160192 A1 * | 7/2008 | Thebault | C23C 16/45593 427/249.2 |
| 2009/0120286 A1 | 5/2009 | Schmid et al. | |
| 2009/0238966 A1 | 9/2009 | La Forest | |
| 2010/0126350 A1 | 5/2010 | Shanna | |
| 2010/0209659 A1 * | 8/2010 | Boskovic | B32B 5/26 428/113 |
| 2010/0313963 A1 | 12/2010 | Skinn | |
| 2011/0104041 A1 | 5/2011 | Centa | |
| 2011/0206842 A1 | 8/2011 | Revankar | |
| 2011/0249803 A1 | 10/2011 | Drory | |
| 2012/0104641 A1 | 5/2012 | La Forest | |
| 2012/0241327 A1 | 9/2012 | Suib | |
| 2014/0356534 A1 * | 12/2014 | Hegermann | C23C 16/32 427/249.2 |
| 2015/0075428 A1 * | 3/2015 | Bertrand | C23C 16/045 118/718 |
| 2015/0240362 A1 | 8/2015 | Choi | |
| 2016/0076488 A1 * | 3/2016 | Henry | F02B 33/42 60/274 |
| 2016/0281218 A1 | 9/2016 | Policandriotes et al. | |
| 2017/0141310 A1 | 5/2017 | Madigan | |
| 2020/0160192 A1 * | 5/2020 | Bernelas | G06N 5/045 |

FOREIGN PATENT DOCUMENTS

| | | |
|---|---|---|
| GB | 682966 | 11/1952 |
| JP | 09251981 | 9/1997 |
| JP | 1045480 | 2/1998 |
| WO | 2009079314 | 6/2009 |
| WO | 2016061652 | 4/2016 |
| WO | 2017087337 | 5/2017 |

OTHER PUBLICATIONS

Tang, Zhong-hua, et al., "Effects of carrier gas on densification of porous carbon-carbon composites during chemical vapor infiltration". Journal CSUT vol. 10, No. 1, Mar. 2003, pp. 7-12.*

Zhang, Mingyu, et al., "Microstructure of pyrocarbon with chemical vapor infiltration". Procedia Engineering 27 (2012) 847-854.*

Sarantopoulos, Christos, et al., "Chemical vapor infiltration of photocatalytically active TiO2 thin films on glass microfibers". Surface and Coatings Technology, 2007, vol. 201, pp. 9354-9358.*

Chen, Jian-xun, et al., "Densification mechanism of chemical vapor infiltration technology for carbon/carbon composites". Trans. Nonferrous Met. Soc. China 17(2007) 519-522.

Kawase, Kazumasa, et al., "Densification of Chemical Vapor Deposition Silicon Dioxide Film Using Ozone Treatment". Japanese Journal of Applied Physics 48 (2009) 101401, pp. 1-7.

Gupte, S.M., et al., "Densification of Porous Materials by Chemical Vapor Infiltration". J. Electrochem. Soc., vol. 136, No. 2, Feb. 1989, pp. 555-561.

Jeong, Hyeok Je, et al., "Densification of Carbon/Carbon Composites by Pulse Chemical Vapor Infiltration". Carbon vol. 34, No. 3, pp. 417-421, 1996.

USPTO, Non-Final Office Action dated Mar. 31, 2017 in U.S. Appl. No. 15/078,882.

USPTO, Final Office Action dated Nov. 3, 2017 in U.S. Appl. No. 15/078,882.

USPTO, Notice of Allowance dated Jan. 23, 2018 in U.S. Appl. No. 15/078,882.

USPTO, Corrected Notice of Allowance dated Jan. 26, 2018 in U.S. Appl. No. 15/078,882.

Policandriotes, Tod., "Design of an Efficient and Rapid Chemical Vapor infiltration (CVI) Re-Circulation System.", A Dissertation Submitted in Partial Fulfillment of the Requirements for the Doctor

(56) References Cited

OTHER PUBLICATIONS of Philosophy in Engineering Science., Department of Mechanical Engineering in the Graduate School Southern Illinois University, Aug. 2013.
European Patent Office, European Search Report dated Mar. 21, 2019 in Application No. 18198926.0.
USPTO; Restriction Requirement Office Action dated Apr. 10, 2018 in U.S. Appl. No. 15/725,620.
USPTO; Non-Final Office Action dated Jun. 14, 2018 in U.S. Appl. No. 15/725,620.
USPTO; Final Office Action dated Jan. 2, 2019 in U.S. Appl. No. 15/725,620.
USPTO; Advisory Action dated Mar. 14, 2018 in U.S. Appl. No. 15/725,620.
USPTO; Non-Final Office Action dated Jun. 28, 2019 in U.S. Appl. No. 15/725,620.
USPTO; Notice of Allowance dated Jan. 10, 2020 in U.S. Appl. No. 15/725,620.
OpenSIUC Website Printout. OpenSIUC is an institutional repository offering permanent, reliable, and free access to Yesearch and scholarly material produced at Southern Illinois University Carbondale, pp. 1-8. Available Mar. 20, 2018 online at: https://opensiuc.lib.siu.edu/. (Year: 2018).
ProQuest Tod Policandriotes Dissertation Website Printout, pp. 1-4. Available Mar. 22, 2018 online at: https://search.proquest.com/docview/14 7 5236652?accountid = 14 7 53. (Year: 2018).
L. V. Interrante et al., "Chemical Vapor Deposition of SiC and AlN Using Organometallic Precursors", in T. M. Besmann et al. Eds. "Chemical Vapor Deposition of Refractory Metals and Ceramics II", MRS Proceedings, vol. 250 (1992), pp. 283-290. (Year: 1992).
OpenSIUC "Tod Policandriotes Dissertation" Webpage Printout, p. 1-2. Available Dec. 24, 2018 on line at: https://opensiuc.lib.siu.edu/dissertations/721 /, (Year: 2018).
J. Chen et al.,"Distribution of Deposited Carbon in Carbon Brake Disc Made by Pressure-Gradient Chemical Vapor Infiltration. "Carbon Sci. 8 [1] (2007). pp. 25-29. (Year: 2007).
K. Sugiyama et al. "Pulse Chemical Vapour infiltration of SiC in Porous Carbon or SIC Particulate Preform Using an R. F. Heating System." J. Mater. Sci. 25 (1990). pp. 4511-4517. (Year: 1990).
S. Bertrand et al "The Thermal Gradient-Pulse Flow CVI Process: a New Chemical Vapor Infiltration Technique for the Densification of Fibre Preforms." J. Eur. Ceram. Soc. 18 (1998). pp. 857-870. (Year: 1998).
OpenSIUC "Content Posted in 2013" Webpage Printout (Cropped), p. 1. Available Dec. 24, 2018 online at: https://opensiuc.lib.siu.edu/2013.html. (Year: 2018).

\* cited by examiner

METHODS FOR CHEMICAL VAPOR INFILTRATION AND DENSIFICATION OF POROUS SUBSTRATES

CROSS-REFERENCE TO RELATED APPLICATIONS

This application is a divisional of, and claims priority to and the benefit of, U.S. Ser. No. 15/725,620, filed Oct. 5, 2017, now U.S. Pat. No. 10,648,075 and entitled "SYSTEMS AND METHODS FOR CHEMICAL VAPOR INFILTRATION AND DENSIFICATION OF POROUS SUBSTRATES." The '620 application is a continuation-in-part of, and claims priority to and the benefit of, U.S. Ser. No. 15/078,882, filed Mar. 23, 2016, now U.S. Pat. No. 9,938,618 and entitled "METHOD FOR RAPID AND EFFICIENT CHEMICAL VAPOR INFILTRATION AND DENSIFICATION OF CARBON FIBER PREFORMS, POROUS SUBSTRATES AND CLOSE PACKED PARTICULATES." The '882 application claims priority to and the benefit of U.S. Provisional Application No. 62/137,214, filed Mar. 23, 2015 and entitled "METHOD FOR RAPID AND EFFICIENT CHEMICAL VAPOR INFILTRATION AND DENSIFICATION OF CARBON FIBER PREFORMS, POROUS SUBSTRATES AND CLOSE PACKED PARTICULATES." All the aforementioned applications are hereby incorporated by reference in their entirety for all purposes.

FIELD

The present disclosure relates to chemical vapor infiltration and densification, and more specifically, to systems and methods of chemical vapor infiltration and densification employing recirculated hydrocarbon gases.

BACKGROUND

Carbon fiber/carbon matrix (C/C) composites are used in the aerospace industry for aircraft brake heat sink materials, among other applications. Silicon carbide (SiC) based ceramic matrix composites (CMCs) have found use as brake materials and other components in automotive and locomotive industries. These composites may be typically produced using, for example, chemical vapor infiltration (CVI) or chemical vapor deposition (CVD). Such processes generally include placing porous preforms into a reactor and introducing a gaseous precursor to form silicon carbide depositions within the pores of the preform. The SiC may be deposited as a coating or series of coatings wherein a porous sample or preform may be densified with carbon then SiC, or with SiC then carbon.

However, conventional infiltration and/or or deposition processes tend to result in byproduct deposits accumulating within system components of the manufacturing system, such as the exhaust piping. The byproduct deposits may be reactive and even pyrophoric, and thus precautions are warranted to promote a safe manufacturing environment. For example, conventional manufacturing systems are often shut-down for periods of time while users manually clean the components and piping of the manufacturing system to remove the byproduct deposits. This cleaning procedure increases the downtime of the manufacturing system and thus decreases the capacity and throughput of conventional ceramic matrix composite manufacturing systems. Buildup of condensable hydrocarbon tars from conventional carbon CVI processes, although not pyrophoric in nature tends to cause reductions in throughput of the plumbing systems (similar to deposits of cholesterol in a person's arteries).

SUMMARY

A system for chemical vapor infiltration and densification is disclosed, in accordance with various embodiments. The system may comprise a reaction chamber and a plurality of conduits fluidly coupled to an exhaust outlet of the reaction chamber. A first set of conduits of the plurality of conduits may define a first flow path and a second set of conduits of the plurality of conduits may define a second flow path. The second flow path may be fluidly coupled to an inlet of the reaction chamber. A roughing pump may be fluidly coupled to the first set of conduits, A first valve may be in operable communication with the first set of conduits. A second valve may be in operable communication with the second set of conduits. A hydrogen extraction component may be in fluid communication with a least one of the first set of conduits or the second set of conduits. The hydrogen extraction component may comprise at least one of a cryogenic-cooler or a pressure swing absorption unit.

In various embodiments, the cryogenic-cooler may be configured to condense hydrocarbon molecules comprised of six or more carbon atoms. A first pump may be downstream from the second valve. The first pump may comprise a constant speed turbo pump, a variable speed turbo pump, a constant speed dry pump, or a variable speed dry scroll pump. A second pump may be downstream of the first pump. The second pump may comprise at least one of a diaphragm pump, a turbo pump, or a dry pump.

In various embodiments, an electric arc may be located proximate the exhaust outlet of the reaction chamber. The electric arc may be configured to breakdown hydrocarbon gases comprised of six or more carbon atoms. A stage may be disposed within a reaction zone of the reaction chamber. The stage may be electrically isolated from a wall of the reaction chamber. The cryogenic-cooler may comprise at least one of a helium cryogenic cooler or a liquid nitrogen condenser.

A method of chemical vapor infiltration and deposition is disclosed, in accordance with various embodiments. The method may comprise disposing a porous substrate within a reaction chamber, establishing a sub-atmospheric pressure within the reaction chamber, introducing a hydrocarbon reaction gas into a reaction zone of the reaction chamber to densify the porous substrate, and withdrawing unreacted hydrocarbon reaction gas from the reaction chamber. The unreacted hydrocarbon reaction may comprise hydrocarbon molecules having six or more carbon atoms. The method may further comprise removing at least a portion of the hydrocarbon molecules having six or more carbon molecules from the unreacted hydrocarbon reaction gas by causing at least a portion of the hydrocarbon molecules having six or more carbon atoms to condense, and recirculating at least a portion of the unreacted hydrocarbon reaction gas back into the reaction zone.

In various embodiments, the method may further comprise applying an electrical voltage to the porous substrate. In various embodiments, removing the portion of the hydrocarbon molecules having six or more carbon molecules from the unreacted hydrocarbon reaction may comprise flowing the unreacted hydrocarbon reaction gas through a trap including one or more sets of rotating blades.

In various embodiments, the method may further comprise extracting hydrogen from the unreacted hydrocarbon reaction gas. In various embodiments, extracting hydrogen may comprise flowing the unreacted hydrocarbon reaction gas through at least one of a cryogenic-cooler or a pressure swing absorption unit. The method may further comprise applying an electric arc to the unreacted hydrocarbon reaction gas withdrawn from the reaction chamber. The method may further comprise heating at least one of the hydrocarbon reaction gas or the portion of the unreacted hydrocarbon reaction gas recirculated into the reaction zone using a charged coil located proximate an inlet of the reaction chamber. The charged coil may provide an electrical conduction path to at least one of charge or ground an interior wall of the reaction chamber.

A system for chemical vapor infiltration and densification is disclosed, in accordance with various embodiments. The system may comprise a reaction chamber and a plurality of conduits fluidly coupled to an exhaust outlet of the reaction chamber. A first set of conduits of the plurality of conduits may define a first flow path and a second set of conduits of the plurality of conduits may define a second flow path. The second flow path may be fluidly coupled to an inlet of the reaction chamber. A hydrogen extraction component may be in fluid communication with a least one of the first set of conduits or the second set of conduits. The hydrogen extraction component may comprise at least one of a cryogenic-cooler or a pressure swing absorption unit.

In various embodiments, the cryogenic-cooler or the pressure swing absorption unit may be configured to condense hydrocarbon molecules comprised of six or more carbon atoms. An electric arc may be located proximate the exhaust outlet of the reaction chamber. A trap may be in fluid communication with at least one of the first set of conduits or the second set of conduits. The trap may include one or more sets of rotating blades configured to trap and condense hydrocarbon molecules having six or more carbon atoms. A plasma conduit may be located upstream from the trap. The plasma conduit may be configured to breakdown a first hydrocarbon molecule having six or more carbon atoms into a plurality of second hydrocarbon molecules each having less than six carbon atoms.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

Figure 1:
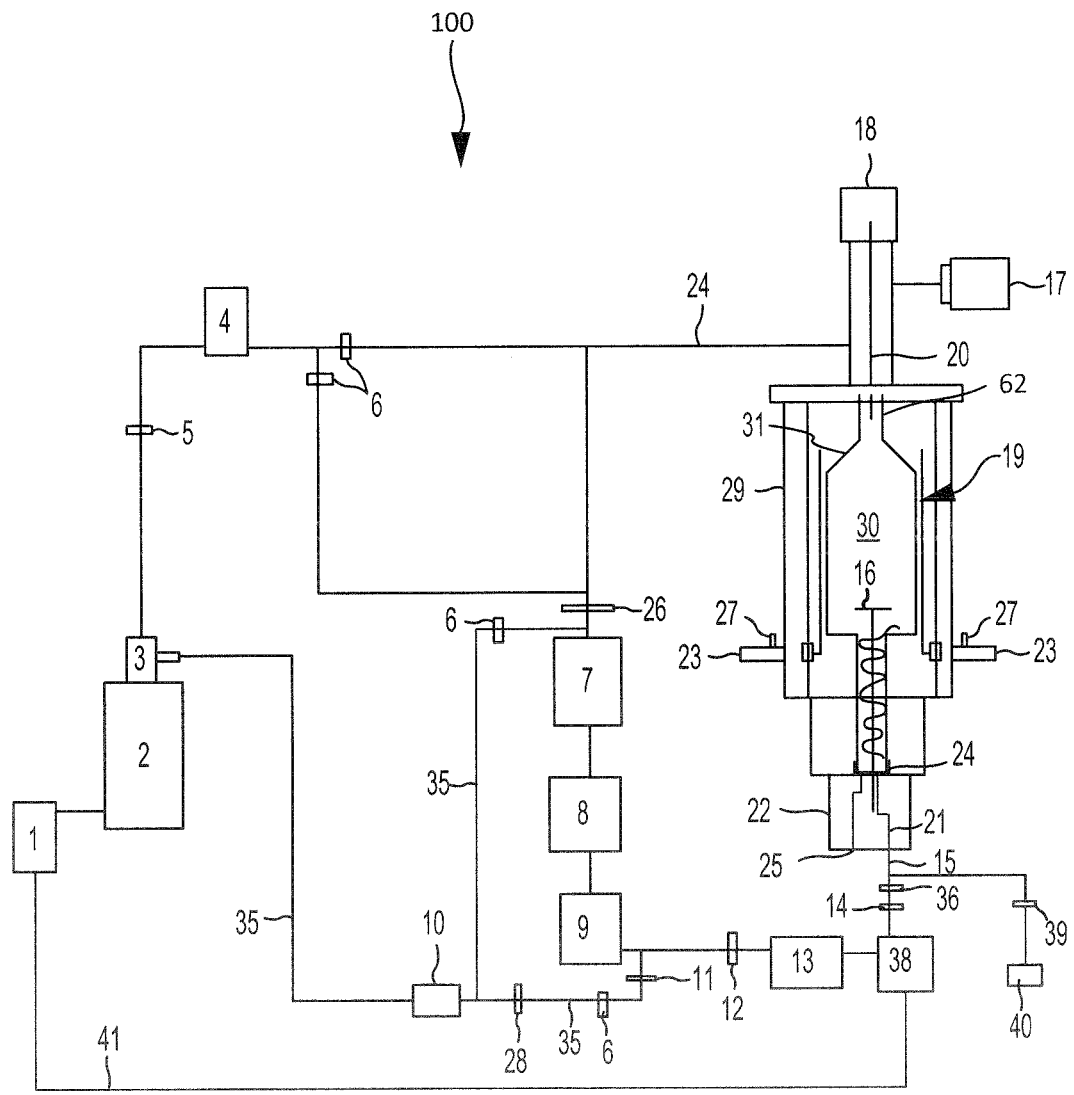
FIG. 1 illustrates a schematic diagram of a system for chemical vapor infiltration and densification comprising a recirculation path, in accordance with various embodiments.

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the exemplary embodiments of the disclosure, it should be understood that other embodiments may be realized and that logical changes and adaptations in design and construction may be made in accordance with this disclosure and the teachings herein. Thus, the detailed description herein is presented for purposes of illustration only and not limitation. The steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Throughout the present disclosure, like reference numbers denote like elements. Accordingly, elements with like element numbering may be shown in the figures, but may not be necessarily be repeated herein for the sake of clarity.

Provided herein, according to various embodiments, are manufacturing systems and associated methods for fabricating C/C composite components. The systems and associated methods may provide for rapid and efficient deposition of carbon on and within carbon fiber preforms, porous substrates, and/or close packed particulates by pyrolytic carbon in the structures of isotropic, anisotropic, graphitic, amorphous, lonsdaleite, and diamond. The preforms, porous substrates, and/or close packed particulates are placed into a vacuum-tight reaction chamber as a shape, form, or mold and may be electrically isolated from the surrounding system. The reaction chamber may include a reaction zone defined by a retort within the reaction chamber. After loading the samples (i.e., the carbon fiber preforms, porous substrates, and/or close packed particulates) in the reaction zone, the reaction chamber may be evacuated to remove atmospheric gases. The samples can be grounded, charged with a positive or negative direct current (DC) voltage, or frequency oscillated using an alternating current (AC) voltage (that can be biased positively or negatively) independent of the whole system. The interior walls of the retort may be either grounded or electrically isolated from the surrounding system and the sample. The retort may be brought to an isothermal or gradient temperature condition above room temperature in a vacuum, with or without an inert gas. Once the set point temperature and pressure are achieved and controlled, one or more dry recycling/recirculating pumps may be activated in a circuit extending between the reaction chamber's exhaust to the reaction chamber's inlet/input. One or more hydrocarbon (CxHy) reaction gases, and/or inert carrier gases, and/or hydrogen gas are input into the vacuum tight reaction chamber/retort, either as a mixture or independently. The hydrocarbon reaction gases, and/or inert carrier gases, and/or hydrogen gas may be brought up to the reaction chamber temperature through a series of tubing coils.

The system may be under constant recycling/recirculating through the duration of the densification process by constant or variable speed dry pumps. One or more valve(s), in fluid communication with the pumps, may be configured to control a recycling/recirculating of effluent gas exhausted from the reaction zone. Translation (e.g., opening or closing) of the valves may pulsate the system and/or cause a cessation of the recycling/recirculating of the effluent gases. The internal system vacuum pressure may be controlled by one or more mass flow/pressure controllers and/or throttle valves located upstream and downstream of the reaction zone. On the exhaust side (downstream side) of the reaction zone, where the exhaust temperature begins to reduce just before the heavy hydrocarbons condense, variable or constant plasma may be created, using an electric arc method, such that the remnant hydrocarbon gases (i.e., the effluent hydrocarbon gases exiting the reaction zone) cross through the plasma when exiting the reaction zone, thereby reducing the heavier hydrocarbons (e.g., hydrocarbons molecules comprised of six or more carbon atoms) to simpler hydrocarbons (e.g., hydrocarbons molecules comprised of five or less carbon atoms). Depending on the particular gas or gas mixture input, additional plasma reactions may be performed near the reaction zone's exhaust point to further reduce the heavy hydrocarbons to simpler hydrocarbons.

At various points in the system plumbing, the downstream exhaust gas (also referred to herein as effluent gas) may be monitored to ascertain the type and/or concentration of hydrocarbon molecules within the exhaust gas. The system may comprise one more valves which may fine tune the process (e.g., adjust the volume, speed, hydrocarbon molecule size, or other feature(s) of the exhaust gas being recycled) to minimize the hydrocarbon gases exiting the system completely. During the process, a mass of the sample (s) (i.e., a mass of the preforms, porous substrates, and/or close packed particulates) may be measured continuously using an in-situ measurement device such as a precision load cell.

A chemical vapor infiltration system 100 for rapidly and efficiently densifying carbon fiber preforms, porous substrates, and close packed particulates by pyrolytic carbon in the structure of one or more of isotropic, anisotropic, graphitic, amorphous, lonsdaleite, and diamond and mixtures of said structures, is shown schematically in FIG. 1, in accordance with various embodiments.

The parts of the system shown in FIG. 1 include:
1. roughing pump
2. turbo pump
3. 3 way valve
4. throttle valve
5. sampling port/valve
6. valves
7, 8, 9. Turbo pumps and/or scroll pumps
10. flow controller
11. pressure measurement
12. valve
13. optional diaphragm pump/plasma chamber
14. sampling port
15. gas inlet tube
16. sample stage
17. pressure measurement
18. high voltage input for plasma
19. retort
20. plasma conduit
21. gas feed
22. load cell/rotary, motor
23. element power feedthrough
24. voltage input for plasma conduits (optional for high efficiency)
25. inert gas input
26. valve
27. inert gas for power feeds
28. gas sampling port
29. insulated water cooled chamber with enclosed element and electrically non-conductive retort
30. reaction zone
31. retort lid/Venturi cone
35. bleed line
36. one way flow valve
38. pressure swing absorption unit
39. mass flow control
40. virgin gas source
41. conduit
62. outlet of reaction zone.

System 100 may comprise a fluid cooled reaction chamber 29. The chamber 29 may be generally cylindrical. In various embodiments, the chamber 29 has an internal diameter of 10.0 inches (25.4 cm), and a height of 16.0 inches (40.6 cm). However, the chamber 29 can be scaled up or down, and the sizes of the other components, such as the power supplies, scaled accordingly. The gas flow rates may also be adjusted to optimize the recirculation and densification process. System 100 may be controlled by engineering software. For example, a suitable systems engineering software may control the system and collect data in real time, and is available from National Instruments, 11500 Mopac Expressway, Austin, Tex. (U.S.A.) under the tradename Labview®.

In various embodiments, a sample may be loaded onto an electrically isolated sample stage/support 16 inside a reaction zone 30 defined by a retort 19 located within the chamber 29. Stated differently, reaction zone 30 may be located within retort 19. In various embodiments, chamber 29 may comprise a vacuum tight oven/furnace. In various embodiments, stage 16 may comprise an in-situ electrically isolated sample balance.

Figure 6A:
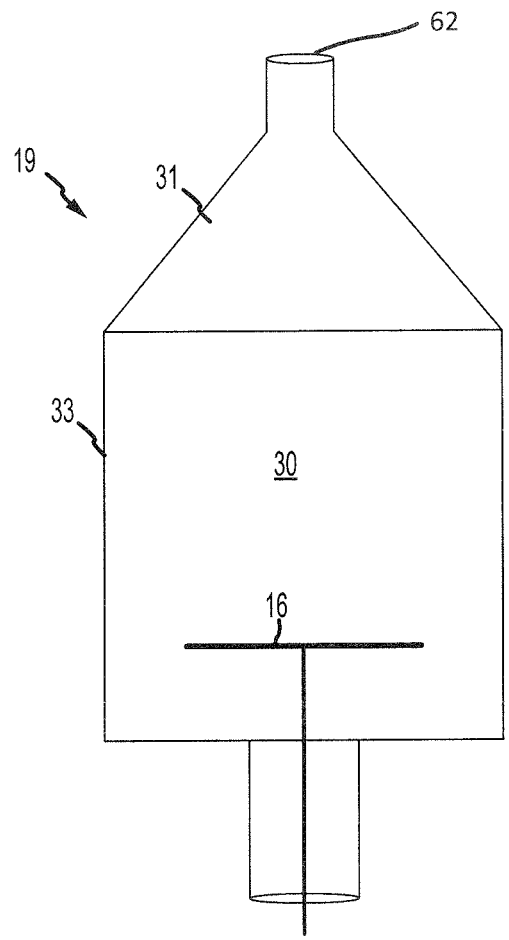
FIG. 6A illustrates a retort having a frustoconical retort lid, in accordance with various embodiments.
Figure 6B:
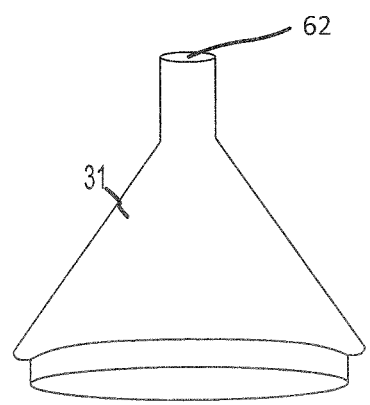
FIG. 6B illustrates a frustoconical retort lid, in accordance with various embodiments.

Referring to FIGS. 6A and 6B, retort 19 may comprise a retort lid 31 coupled to a generally cylindrical retort body 33. Retort lid 31 may be located proximate an outlet 62 of reaction zone 30. Retort lid 31 may be configured to have a Venturi effect at the outlet 62 of reaction zone 30. In various embodiments, retort lid 31 may comprise a Venturi cone. Stated differently, retort lid 31 may comprise a generally frustoconical shape.

Atmospheric gases may be evacuated with a roughing vacuum pump 1 and/or turbo vacuum pump 2 to a pressure below 2 Torr (266.6 pascal (Pa)). Inert gas may be input into reaction zone 30 to force out any remaining atmospheric gases in the reaction zone 30 and/or chamber 29. The chamber 29 is heated to the desired temperature set point with a heater, and the pressure is maintain below 100 Torr (13,332.2 Pa). Inert gas may be provided to the chamber 29 through the power feedthroughs 23/25 at flows less than or equal to 150 standard cubic centimeter per minute (sccm or $cm^3$/min) (i.e., less than or equal to 9.15 $in^3$/min) at the location of the stage 16. When the set point temperature (isothermal or gradient), is reached, one or more dry recycling/recirculating pumps 7, 8, 9, and/or 13 may be turned on. Pumps 7, 8, 9, and 13 may comprise one or more constant or variable speed turbo pumps, constant or variable speed dry pumps, diaphragm pumps, or other suitable pump and/or combinations thereof.

The exhaust to inlet circuit is opened and the flow and make-up of the recirculated gas can be measured and analyzed at a point (e.g., at sampling port 14) before the recirculated gases are input into reaction zone 30. For example, the recirculated gas may be analyzed proximate to a low pressure one way flow valve 36 located just prior to (i.e., upstream from) the point where the recirculated gas and virgin gas are combined and input into reaction chamber 29. As used herein, "virgin gas" refers to gas that has not yet flowed through reaction zone 30. As used herein, "recirculated gas" refers to gas that has flowed through reaction zone 30 at least one time. In various embodiments, prior to being input into reaction zone 30, the virgin gas and the recirculated gas may be combined in a single conduit (e.g., gas inlet tube 15). In various embodiments, the virgin gas and the recirculated gas may be input into reaction zone 30 via separate conduits. Stated differently, a first conduit may be coupled between virgin gas source 40 and reaction zone 30, and a second conduit, discrete from the first conduit, may be coupled between one way flow valve 36 and reaction zone 30. In various embodiments, a mass flow control (MFC) 39 may be in operable communication with virgin gas source 40 and may measure and control a flow rate of virgin reaction gas input into reaction zone 30. In various embodiments, the flow of virgin gas may be adjusted in response to data obtained at sampling port 14.

The vacuum pressure may be set to a desired level and exhausted through a flow controller such as a throttle valve 4 at a point immediately after the first recycle/recirculating turbo pump 7 connected by conduits and separated by a valve 26 that can be opened or closed at any time for the process. The diameter/orifice size of the conduits and valves may be varied throughout system 100 to control flow output to the throttle valve 4. The output may pass through a secondary turbo pump 2 just prior to the roughing vacuum pump 1. Virgin hydrocarbon reaction gases such as for example, methane 0-100 liter per minute (L/min) (0-26.4 gal/min), propane 0-50 L/min (0-13.2 gal/min), natural gas mixtures 0-150 L/min (0-39.6 gal/min), or any desired hydrocarbon reaction gas can be introduced right after the one way flow valve 36 on the inlet/upstream side of reaction zone 30. Hydrogen can be included or excluded from the process depending on the microstructure desired. For example, a pressure swing absorption swing (PSA) 38 or magnetite filter may be located upstream of one way flow valve 36, and may extract hydrogen from the recirculated gas. The pressure within system 100 may be maintained below 100 Torr (13,332.2 Pa), either at a constant pressure or pulsed from a low pressure to a higher pressure 100 Torr or less (13,332.2 Pa or less)

The sample(s), which may be located on stage 16, can either be grounded or charged by a constant positive or negative DC voltage or an AC voltage that can be frequency varied and/or positively/negatively biased. The walls of the retort 19 can be grounded, or positively or negatively charged, but are isolated from the sample(s). In various embodiments, the sample may be negatively charged, and the walls of the retort 19 may be configured to be insulating. The contact between the reaction gases and the heating elements may be minimized. The Venturi effect may be utilized at the exhaust side of the chamber 29/retort 19 (i.e., at lid 31) to separate the phases of the reaction gas. The Venturi effect may also be utilized at the first recirculating turbo pump 7. At a point on the exhaust side of reaction zone 30 (i.e., after outlet 62) and before the first recycle/recirculating pump 7, a bleed line 35 may be fed to a precision flow controller 10 (e.g., a throttle valve), which bypasses the throttle valve 4, and to the primary exhaust turbo pump 2 before the roughing pump 1. In this regard, a portion of the gas downstream of valve 26 may be directed through bleed line 35 to roughing pump 1. Bleed line 35 may also fluidly coupled to a point after (i.e., downstream from) the recycle/recirculating pumps 7, 8, 9. In this regard, a portion of the gas downstream from pump 9 may be directed through bleed line 35 to roughing pump 1. When the main throttle valve 4 is closed, the precision flow controller 10 may be engaged to control the pressure within system 100. In various embodiments, the conduits of bleed line 35 may have a diameter that is equal to or less than ¼th the diameter of the main recirculating path plumbing (i.e., conduits). The exhaust gas can be analyzed (e.g., at sampling port 28) and the recirculating flow rate adjusted to increase the process efficiency. For example, in response to the data output from sampling port 28, a larger or a smaller portion of the recirculated gas may be directed through bleed line 35 and roughing pump 1 to maintain a desired pressure and/or recirculation flow rate within system 100. Because the system is continuously recycled/recirculated, the main upstream flow inlet can be shut off simultaneously with the exhaust and recirculated to extract most of the carbon in the hydrocarbon gases.

During the process described above, an electric arc variable frequency or fixed dc corona plasma 20 can be implemented at the Venturi point (i.e., the retort lid 31) at the outlet 62 of reaction zone 30, near where the exhausting gas begins to condense out the heavy hydrocarbons as tars in order to breakdown and form simpler hydrocarbon reaction gases for the purpose of recycling/recirculating back into reaction zone 30. Additional electric arc corona plasmas can be used prior to the bleed line 35 before the first recycling/recirculating pump 7. To extract excess hydrogen on the exhaust side a magnetite filter can be used after the plasma treatment. In addition, the entire recirculating plumbing, before and after (upstream of and downstream of) the turbines of pumps 7, 8, 9, can be high temperature plasma transfer lines. The recirculating plumbing may be designed to incorporate a solenoidal electromagnet system surrounding the plasma tubing thereby enhancing the partially/fully ionized plasma and allowing for further adjustment of stream density and direction.

Pumps 7, 8, 9, may comprise a controllable variable speed turbo/turbine vacuum pump with either an in-line or 90 degree exit port that can operate at vacuum pressures above 3 Torr (400.0 Pa) with the turbine blades made from stainless steel, CMC or other high strength, high temperature alloys or composites. The entrance and/or exit ports of the pumps 7, 8, 9 may utilize the Venturi effect to enhance gas flow. The pumps 7, 8, 9 can be air powered, electric motor powered, fluid powered, etc. with or without magnetic bearings. The higher the rpm the better as far as flow capability. Though there may be no upper limit, a lower limit of 10,000 rpm may be reasonable for the system.

Pumps 7, 8, 9, may comprise one or more constant or variable speed inline turbo pump(s) or 90 degree turbo pump(s), or one or more constant or variable speed dry pump(s). Pumps 7, 8, 9 may be used to recycle/recirculate the reaction gases not consumed in the first pass through the reaction zone 30 (i.e., the gases output at outlet 62). In various embodiments, system 100 may employ pumps 7, 8, 9 without plasma circulation.

In various embodiments, partially or fully ionized hydrocarbon, argon, helium, hydrogen or combinations and mixtures of gases including a hydrocarbon gas, may use plasma conduits to flow and recirculate said gases with or without the use of one or more the pumps 7, 8, 9 to aid in the recirculation.

A dry diaphragm pump 13 can be used either alone or in combination with one or more of the pump(s) 7, 8, 9 to recycle/recirculate the hydrocarbon gases in the CVI/CVD process to improve efficiency and the rate of carbon deposition (i.e. preform densification).

In various embodiments, hydrocarbon gases, including heavy hydrocarbons, are recycled/recirculated and/or modified to improve the rate of densification and the efficiency of the CVI/CVD process.

In various embodiments, an electric arc corona plasma may be used to breakdown heavy hydrocarbon gases by either constant or variable DC voltages and/or constant or variable frequency AC voltages that can be biased negatively or positively. For increased efficiency, the plasma may be contained within the complete recirculation circuit such that the recirculated gases are dissociated and kept at a high temperature.

The sample(s) to be densified may be electrically isolated from the system and either grounded or negatively or positively charged with DC voltage or by an AC voltage which can be frequency modulated and biased positively or negatively to increase the rate of deposition and the efficiency.

The retort 19 may be electrically isolated from the sample (s). The retort may be grounded, or charged with DC or AC voltages.

A turbo vacuum pump 7 can be followed by a dry diaphragm pump 13 or multiple turbo pumps 8, 9 to aid in building up a pressure higher than the reaction chamber 29 pressure at the reaction gas entrance point to open an alternative one way flow valve 36 directed toward the reaction chamber/retort to facilitate continuous or pulsed recirculation.

The efficiency of the CVI/CVD process in depositing carbon may be greater than 5% as measured by the total mass of carbon contained in the total volume of the hydrocarbon gases used when compared to the mass gain of the preform, substrate or particulate mold. The sample(s) may be weighed using an in-situ measurement process and device in the CVI/CVD system.

An electrically isolated coiled tube in or near the electrically isolated retort 19 can be provided to preheat the incoming reaction gases and provide an electrical conduction path to charge or ground the interior walls of the electrically isolated retort.

The Venturi effect can be used to separate the phases of the hydrocarbon gases exiting the retort 19 for increasing efficiency using a plasma at the point prior to or at the heavy hydrocarbon condensation point within the reaction chamber exit tube.

In various embodiments, the recirculating/recycling may occur after the roughing vacuum pump 1, which may be a dry vacuum pump or a liquid vacuum pump. For example, in various embodiments, at least a portion of the effluent gas exiting roughing pump 1 may be recirculated into reaction zone 30 via a conduit 41. In various embodiments, after the roughing pump 1, the effluent gas may go through a pressure swing unit 38 or magnetite filter to extract hydrogen before circulating back into the reaction zone 30.

In system 100, the effluent gases output from reaction chamber 29 (also referred to herein as unreacted hydrocarbon gas), at a pressure below atmospheric (e.g., less than 760 Torr (i.e. less than 101,325.0 Pa)), are recirculated in a semi-closed loop. In various embodiments, the effluent gases may be recirculated through a condensing/plasma/"whipper" system configured to remove condensable hydrocarbons of C6 variation or larger (i.e., hydrocarbons comprising six or more carbon atoms). In various embodiments, the effluent gases may be recirculated through a condensing/plasma/"whipper" system configured to remove condensable hydrocarbons of C5 variation or larger (i.e., hydrocarbons comprising five or more carbon atoms). The recirculated effluent gases may then be input into the reaction zone 30. System 100 comprising a semi-closed loop allows the effluent gases to remain within the system plumbing such that a pressure throughout the system 100 remains fairly constant (e.g., the pressure remains under 100 Torr (13,332.2 Pa)). The closed system may allow for increased efficacy and lower energy costs as compared to conventional recirculation systems, wherein the effluent gasses are removed from the system plumbing, filtered, and re-pressurized in an external tank before being added back into the higher pressure input stream. In system 100, the recirculated effluent gases may increase the number of moles of small carbon molecules flowing through reaction zone 30 and available for deposition within the porous substrate, without increasing the flow and/or amount of initial (i.e., virgin) reaction gas input into the system. Stated differently, recirculating the effluent gases may increase the densification rate, as more molecules are passing through the reaction zone, which increases the number of molecules that will make collisions (i.e., bond) with the porous substrate. Accordingly, the disclosed CVI/CVD systems and methods may allow for faster densification of carbon fiber preforms and/or densification to greater than 1.7 g/cc. The disclosed systems and methods of may further alleviate a need to machine the substrate to reopen closed surface pores during densification. In this regard, the substrate densification may be completed in a single CVI/CVD cycle.

Figure 2:
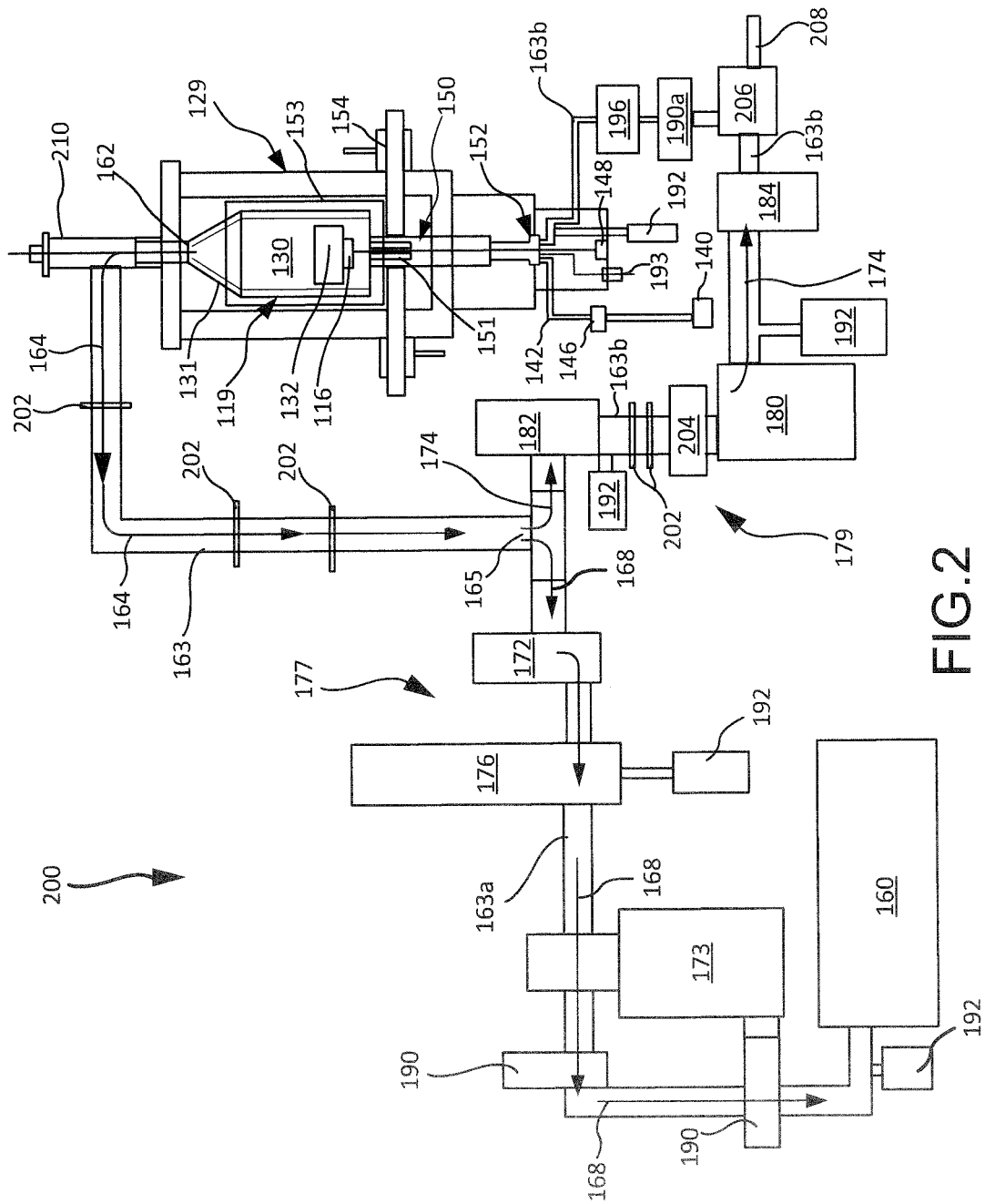
FIG. 2 illustrates a schematic diagram of a system for chemical vapor infiltration and densification comprising a recirculation path, in accordance with various embodiments.

With reference to FIG. 2, a system 200 for chemical vapor infiltration and densification is illustrated, in accordance with various embodiments. System 200 may comprise a reaction chamber 129. Reaction chamber 129 may comprise a retort 119 defining an internal reaction zone 130. Stated differently, reaction zone 130 is located in the interior of retort 119.

Retort 119 may be similar to retort 19 in FIG. 6A. Retort 119 may comprise a retort lid 131, similar to retort lid 31 in FIG. 6B. Retort lid 131 may be configured to have a Venturi effect. In various embodiments, retort lid 131 may comprise a Venturi cone. Stated differently, retort lid 131 may comprise a generally frustoconical shape. Retort lid 131 may be located proximate an outlet 162 of reaction zone 130.

A stage 116 is located within reaction zone 130. Stage 116 may be electrically isolated from various other components of system 200 (e.g., from the heating elements 153 and or walls of retort 119). During CVI/CVD, porous preform(s) 132 may be disposed on stage 116. The porous preform(s) 132 may be grounded, charged with a positive or negative DC voltage, or frequency oscillated using an AC voltage that can be biased positively or negatively.

A virgin gas source 140 may be fluidly coupled an inlet 152 of reaction chamber 129 via a conduit 142. As used herein, "virgin gas" refers to gas that has not yet been sent through the reaction zone 130. Virgin gas source 140 may supply methane, ethane, propane, butane, natural gas mixtures, or any desired hydrocarbon reaction gas to reaction zone 130. An MFC 146 may be in operable communication with virgin gas source 140 and may measure and control a flow rate of virgin reaction gas input into reaction zone 130. For example, MFC 146 may cause virgin gas source 140 to output between 0-50 liter standard per minute (L/min) of virgin reaction gas into reaction zone 130. In various embodiments, MFC 146 may cause virgin gas source 140 to output between 0-100 liters/min (L/min) of virgin reaction gas into reaction zone 130. In various embodiments, MFC 146 may cause virgin gas source 140 to output between 0-150 L/min (0-39.6 gal/min) of virgin reaction gas into reaction zone 130. System 200 may comprise a load cell 148 configured to measure a mass of porous substrate 132 at various points, or continuously, throughout the CVI/CVD process. MFC 146 may adjust the flow of virgin gas input into reaction zone 130, in response to data output from one or more pressure or other type sensors 192 located within system 200. In various embodiments, a pressure within system 200 is maintained at or below 100 Torr (13,332.2 Pa).

One or more inert gas inlets 154 may be in fluidly coupled to reaction zone 130. Inert gas (e.g., argon and nitrogen) may be input into reaction zone 130 to force atmospheric gases from reaction zone 130. One or more heating elements 153 may be employed to heat reaction zone 130 to a desired temperature (isothermal or gradient).

A pre-heat zone 150 may be located between reaction zone 130 and inlet 152 of reaction chamber 129. Inlet 152 may comprise an inlet for inputting the virgin reaction gases and the recirculated gases, as discussed in further detail below, into reaction chamber 129. Pre-heat zone 150 may comprise heated and/or charged coils 151 configured to increase a temperature of the reaction gases (e.g., the virgin recirculated gases) entering reaction zone 130. In various embodiments, coils 151 provide an electrical conduction path to charge or ground an interior wall of retort 119. In various embodiments, a high voltage and inert gas feedthrough 193 may be located proximate inlet 152.

One or more conduits 163 may fluidly couple a roughing pump 160 an exhaust outlet 162 located at retort lid 131. In that regard, effluent gases 164 may be drawn out of reaction zone 130 by roughing pump 160. The effluent gases 164 may exit reaction zone 130 via outlet 162.

Upon exiting outlet 162, effluent gases 164 may be directed through conduits 163. In various embodiments, conduits 163 may diverge at an intersect point 165 such that a first set of conduits 163a define, at least a portion of, a first fluid path 177, and a second set of conduits 163b define, at least a portion of, a second fluid path 179. In that regard, effluent gases 164 may flow along fluid path 177 (also referred to herein as an "exit path"), represented by arrows 168, toward roughing pump 160 and/or effluent gases 164 may flow along a fluid path 179 (also referred to herein as a "recirculation path"), indicated by arrows 174, toward inlet 152. In various embodiments, at least a portion of the effluent gas 164 entering recirculation path 179 may be recirculated back into reaction zone 130 via conduits 163b. A first valve 172 may be located between roughing pump 160 and the intersect point 165. In various embodiments, a turbo pump 173 may be located between the first valve 172 and the roughing pump 160. In various embodiments, a throttle valve 176 may located downstream of the first valve 172. Stated differently, effluent gases 164 flow through throttle valve 176 after flowing though first valve 172. The vacuum pressure within reaction zone 130 and throughout system 200 may be maintained at a desired level by opening and closing throttle valve 176 and first valve 172 and/or by increasing and decreasing the speed of roughing pump 160 and turbo pump 173.

A pump 180 may be located along the recirculation path 179. Pump 180 may include a turbo pump (e.g., a constant speed or a variable speed turbo pump), a dry pump (e.g., a constant speed or a variable speed dry scroll pump or a constant speed or a variable speed dry screw pump), or other pump capable of operating at vacuum pressures greater than 3 Torr and less than 100 Torr (i.e., greater than 400.0 Pa and less than 13,332.2 Pa). A second valve 182 may be located between pump 180 and intersect point 165. First valve 172 and second valve 182 may regulate the flow and/or portion of effluent gases 164 within exit path 177 and recirculation path 179. Pump 180 may comprise an in-line exit port or a 90 degree exit port. Pump 180 may comprise blades made from stainless steel, CMC or other high strength, high temperature alloys or composites. In various embodiments, a second pump 184 may be located downstream of pump 180 and second valve 182. Second pump 184 may include a turbo pump, a dry pump, or other suitable pump. In various embodiments, second pump 184 may comprise a diaphragm pump.

Pump 180 and/or second pump 184 may be turned on and second valve 182 may be opened to direct at least a portion of effluent gases 164 into recirculation path 179. At least a portion of gas effluent gases 164 within recirculation path 179 may be input into reaction zone 130, thereby increasing the number of moles of carbon passing through reaction zone 130 and available for reaction with porous substrate 132. In various embodiments, a volume flow meter 196 may be in operable communication with first valve 172, second valve 182, and/or a valve 190a to control the flow effluent gases 164 entering recirculation path 179. Stated differently, volume flow meter 196 may be in operable communication with first valve 172, second valve 182, and/or valve 190a to control the flow effluent gases 164 entering reaction zone 130. In various embodiments, prior to being input into reaction zone 130, the virgin gas and the recirculated gas may be combined in a single conduit (as shown in FIG. 1). In various embodiments, the virgin gas and the recirculated gas may be input into reaction zone 130 via separate conduits. Stated differently, a first conduit (e.g. conduit 142) may be coupled between virgin gas source 140 and inlet 152, and a second conduit (e.g., conduit 163b), discrete from the first conduit, may be coupled between valve 190a and inlet 152.

In various embodiments, additional valves 190 may be located along exit path 177 and/or recirculation path 179. Valves 190 may be configured to regulate a flow of effluent gas 164 through system 200. Valves 190, in combination with roughing pump 160 and/or pump 180, may also aid in maintaining the desired pressure level within system 200. Opening or closing one or more valves 190 and/or adjusting a speed of roughing pump 160 and/or pump 180 may control the flow rate of effluent gas 164 through exit path 177 and recirculation path 179. One or more pressure or other type sensor 192 may be located throughout system 200. Valves 190 may be opened or closed and the speed of roughing pump 160 and/or pump 180 may be adjusted in response to data output from sensors 192.

In various embodiments, one or more plasma conduits 202 may be located between effluent gas outlet 162 and second valve 182 and between second valve 182 and a trap 204. Plasma conduits 202 may breakdown longer hydrocarbon chains. In various embodiments, plasma conduits 202 may breakdown a hydrocarbon molecules containing six or more carbon atoms into two or more hydrocarbon molecules containing less than six carbon atoms. For example, plasma conduits 202 may breakdown a hydrocarbon molecule containing six carbon atoms into two hydrocarbon molecules each containing three carbon atoms, or into one hydrocarbon molecule containing four carbon atoms and one hydrocarbon molecule containing two carbon atoms, or into three hydrocarbon molecules each containing two carbon atoms. A frequency of the plasma conduits maybe selected to breakdown a particular molecule size. In various embodiments, the frequency of the plasma conduits 202 may be selected to breakdown hydrocarbon molecules containing six or more carbon atoms. In various the frequency of the plasma conduits may be selected to breakdown hydrocarbon molecules containing five or more carbon atoms. In various embodiments, additional plasma conduits may be located downstream of trap 204.

In various embodiments, trap 204 may be located downstream from second valve 182. Trap 204 may comprise a one more sets of spinning blades. The rotating blades may be configured to condense hydrocarbons having six or more carbon atoms. In various embodiments, heavier hydrocarbon (e.g., hydrocarbons comprised of six or more carbon atoms) may condense in trap 204, thereby leaving smaller hydrocarbon molecules in the gaseous state. Stated differently, the effluent gas output from trap 204 may comprise primarily smaller hydrocarbons (e.g., hydrocarbons comprised of fewer than six carbon atoms).

In various embodiments, a hydrogen extraction component 206 may be disposed along recirculation path 179. Hydrogen extraction component 206 may be configured to separate hydrogen gas from the effluent gas. In various embodiments, hydrogen extraction component 206 comprises a PSA unit and/or magnetite filter configured to remove hydrogen from the effluent gas. The extracted hydrogen may exit recirculation path 179 via a conduit 208. Removal of excess hydrogen may increase efficiency and densification rates as hydrogen may tend to inhibit carbon deposition (i.e., densification of porous substrate 132) in reaction zone 130.

In various embodiments, an electric arc variable frequency or fixed DC corona plasma 210 may be implemented at the Venturi point at outlet 162 (i.e., proximate to retort lid 131). The electric arc variable frequency or fixed DC corona plasma may facilitate condensation of heavy hydrocarbons, which may lead to formation of lighter hydrocarbon reaction gases within the effluent gas 164 flowing through recirculation path 179 and into reaction zone 130.

In system 200, the effluent gases 164 output from reaction zone 130, may be kept at a pressure below atmospheric (e.g., less than 760 Torr (101,325.0 Pa)), as the conduits 163 form a semi-closed loop. In various embodiments, the effluent gases 164 may be recirculated through a condensing/plasma/"whipper" system to remove condensable hydrocarbons of C5 variation or larger (i.e., hydrocarbons comprising 5 or more carbon atoms). The recirculated effluent gases 164 may then be input into the reaction zone 130. In this regard, the recirculated effluent gases 164 remain within the system 200 plumbing such that a pressure throughout the system 200 remains fairly constant (e.g., the pressure remains under 100 Torr (13,332.2 Pa)). The closed system may allow for increased efficacy and lower energy costs as compared to conventional recirculation systems, wherein the effluent gasses are removed from the system plumbing, filtered, and re-pressurized in an external tank before being added back into the higher pressure input stream.

Recirculating effluent gases 164 may increase the number of moles of small carbon molecules (e.g., molecules having five or less carbon atoms or, for example, molecules having four or less carbon atoms) flowing through the reaction zone 130 and available for deposition within the porous substrate 132, without increasing the flow and/or amount of virgin reaction gas input into the system. Stated differently, recirculating effluent gas 164 may increase deposition/densification rates, as more molecules are passing through the reaction zone 130, which increases the number of molecules that will make collisions (i.e., bond) with the porous substrate 132. Accordingly, the disclosed system and method of CVI/CVD may allow for faster densification of carbon fiber preforms and/or densification to greater than 1.7 g/cc. The disclosed system and method may also alleviate a need to machine porous substrate 132 to reopen closed surface pores. In this regard, system 200 may allow the densification of porous substrate 132 to be completed in a single CVI/CVD cycle.

Figure 3:
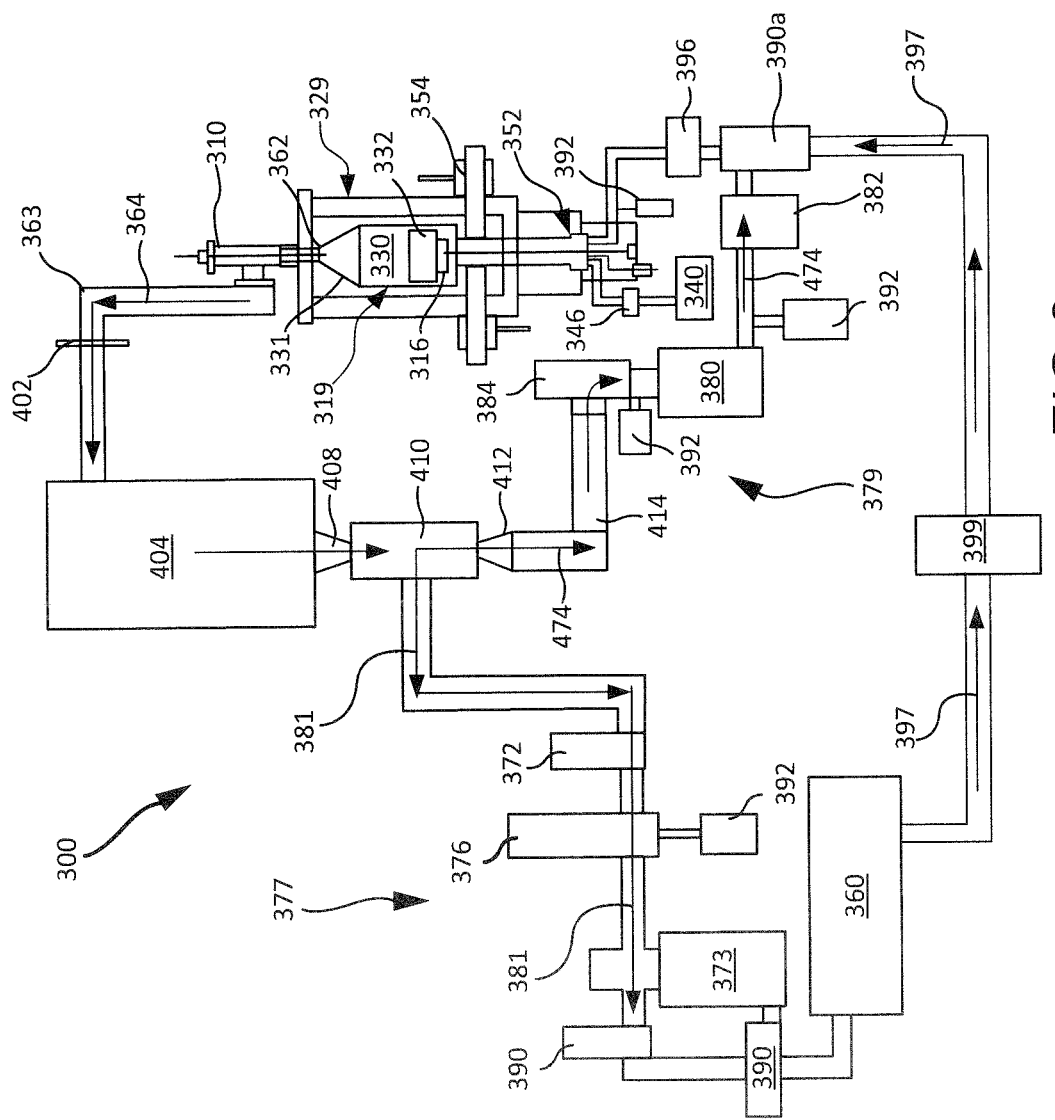
FIG. 3 illustrates a schematic diagram of a system for chemical vapor infiltration and densification comprising a recirculation path and cryogenic cooling stage, in accordance with various embodiments.

With reference to FIG. 3, a system 300 for chemical vapor infiltration and densification comprising a recirculation path with cryogenic cooling stage is illustrated, in accordance with various embodiments. System 300 may comprise a reaction chamber 329 comprising a retort 319 that defines a reaction zone 330. Stated differently, reaction zone 330 is located in the interior of retort 319. Retort 319 may be similar to retort 19 in FIG. 6A. Retort 319 may comprise a retort lid 331, similar to retort lid 31 in FIG. 6B. Retort lid 331 may be configured to have a Venturi effect. In various embodiments, retort lid 331 may comprise a Venturi cone. Stated differently, retort lid 331 may comprise a generally frustoconical shape. Retort lid 331 may be located proximate an outlet 362 of reaction zone 330.

A stage 316 may be located within reaction zone 330 and may support one or more porous substrates 332, during the CVI/CVD process. Virgin gas may be input, from virgin gas source 340, into reaction zone 330 via an inlet 352 of reaction chamber 329. An MFC 346 may be in operable communication with virgin gas source 340 and may measure and control a flow rate of virgin reaction gas input into reaction zone 330. One or more inert gas inlets 354 may be in fluidly coupled to reaction zone 330. Inert gas may be input into reaction zone 330 to force atmospheric gases from reaction zone 330. Effluent gas 364 may exit reaction zone 330 via the outlet 362 located at retort lid 331. Upon exiting outlet 362, effluent gas 364 may be directed through a series of conduits (e.g., pipes) 363. In various embodiments, an electric arc variable frequency or fixed DC corona plasma 310 may be employed downstream of exhaust outlet 362.

In various embodiments, one or more plasma conduits 402 may be located between outlet 362 and a trap 404. In various embodiments, trap 404 may comprise a "whipper" having one or more sets of rotating blades configured to breakdown (i.e., condense) larger hydrocarbons. For example, a temperature within trap 404 may cause hydrocarbon molecules comprising six or more carbon atoms to condense.

System 300 may comprise a cryogenic-cooler 410. In various embodiments, cryogenic cooler 410 may be a helium (He) cryogenic cooler or a liquid nitrogen condenser. Cryogenic-cooler 410 may be employed to condense (i.e., liquefy) lighter hydrocarbon gases (e.g., hydrocarbons gases comprising hydrocarbon molecules having six or less carbon atoms, or, for example, hydrocarbon gases comprising hydrocarbon molecules having five or less carbon atoms). Condensing hydrocarbon gases may allow hydrogen, which remains in a gaseous state, to be readily extracted from cryogenic cooler 410. In this regard, cryogenic-cooler 410 may comprise a hydrogen extraction component. A frustoconical shaped conduit 408 may couple trap 404 and cryogenic-cooler 410. The frustoconical shape of conduit 408 may facilitate a Venturi effect. The gaseous hydrogen may exit cryogenic-cooler 410 along exit path 377 (i.e., indicated by arrows 381). The liquefied hydrocarbons may accumulate in a conduit 414. A frustoconical shaped conduit 412 may be located at the exhaust outlet of cryogenic cooler 410 and may be fluidly coupled to cryogenic-cooler 410 and conduit 414. The frustoconical shape of conduit 412 may allow for expansion of the hydrocarbons exiting cryogenic-cooler 410 and may facilitate a phase change of the hydrocarbons from the liquid state to the a gaseous state. Once most or all the hydrogen is removed, the liquefied hydrocarbons may be heated within conduit 414. The heating returns the small hydrocarbons to a gaseous state.

A valve 384 may be opened and one or more pumps (e.g., a primary pump 380 and one or more secondary pumps 382) located along recirculation path 379 may be turned on such that the gaseous hydrocarbons will flow from conduit 414 through recirculation path 379 (indicated by arrows 474). The flow of the effluent gas 364 through recirculation path 379 may be controlled via valve 384, primary pump 380, and/or one or more secondary pumps 382. In various embodiments, a volume flow meter 396 may be in operable communication with a valve 390a (e.g., a one way flow valve) to control the flow of recirculated gas entering reaction zone 330.

The flow of effluent gas 364 and the hydrogen gas extracted in cryogenic cooler 410 may be controlled via a valve 372, a throttle vale 376, a roughing pump 360, and/or a turbo pump 373. In various embodiments, a portion 397 of the effluent gas output from roughing pump 360 may be recirculated back into reaction zone 330. A compressor pump 399 may be located downstream of roughing pump 360. In various embodiments, compressor pump 399 may comprise a second cryogenic-cooler, PSA, magnetite filter, or other hydrogen extraction component.

The vacuum pressure within reaction zone 330 and system 300 may be maintained at the desired level by opening and closing throttle valve 376, valve 372, and/or valve 384 and by increasing and decreasing the speed of roughing pump 360 and/or pump 380. In various embodiments, additional valves 390 may be located along the exit path 377 and/or recirculation path 379. One or more pressure or other type sensor 392 may be located throughout system 300. Valves 390 may be configured to regulate flow of effluent gas 364 through system 300. Opening or closing one or more valve 390 may control the flow rate of effluent gas 364 through exit path 377 and/or recirculation path 379. Opening or closing one or more valves 390 may also help maintain the desired pressure level within system 300.

Figure 4:
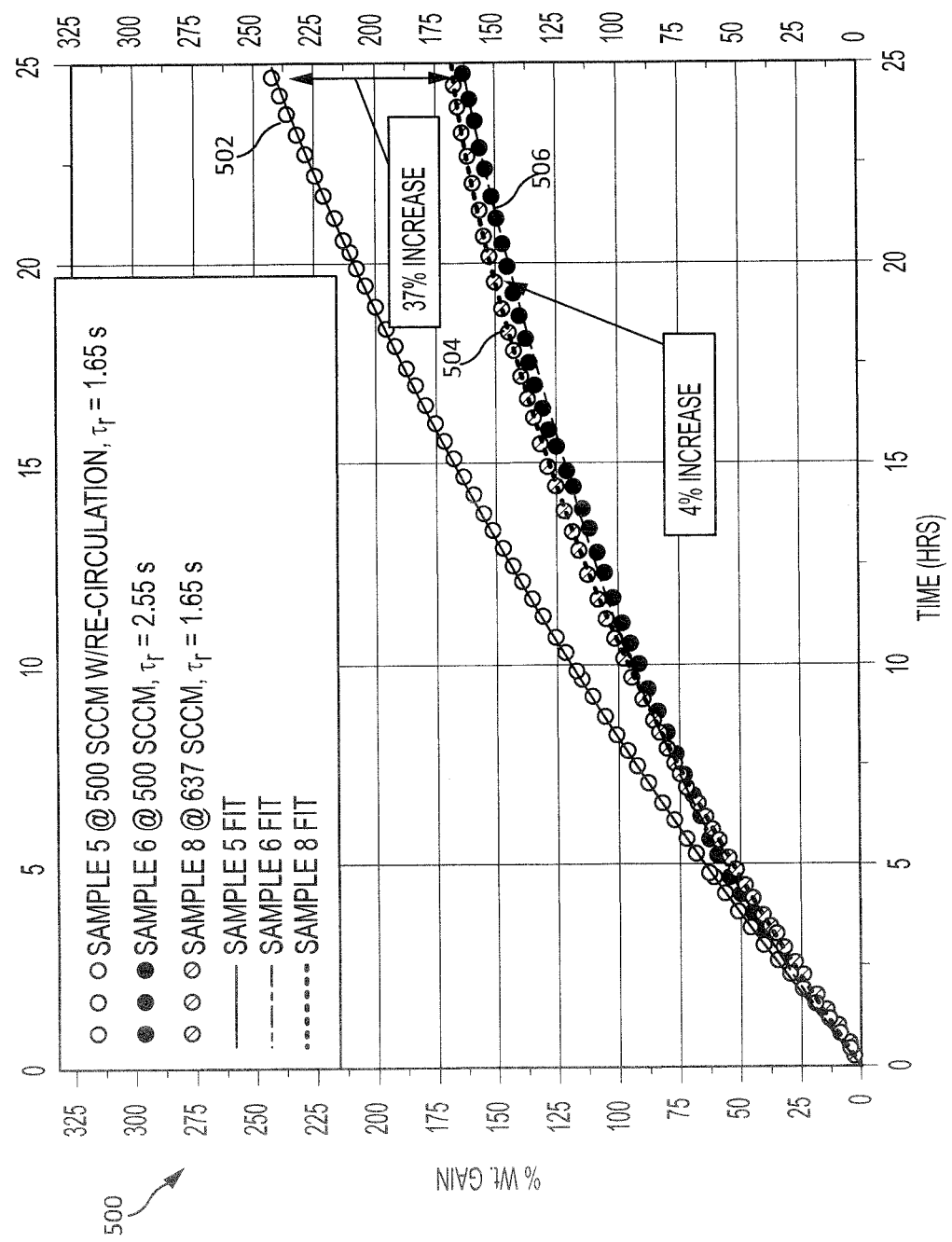
FIG. 4 is a graph comparing densification of porous structures in CVI/CVD systems employing recirculated effluent gas to densification of porous structures in CVI/CVD systems employing an increased virgin reaction gas flow rate, in accordance with various embodiments.

FIG. 4 is a graph 500 comparing the weight gain (i.e., densification) of a porous substrate sample 5 within a CVI/CVD system employing recirculated effluent gas (line 502), as disclosed herein, to the weight gain of a porous substrate sample 8 within a CVI/CVD system employing an increased virgin gas flow rate (line 504), to the weight gain of a porous substrate sample 6 within a control CVI/CVD system (line 506). Graph 500 illustrates that at 25 hours, an increased virgin gas flow rate increased the weight gain of the porous substrate, as compared to the weight gain of the control substrate, by approximately 4%. Whereas, at 25 hours recirculating effluent gas increased the weight gain of the sample substrate, as compared to the weight gain of the control substrate, by approximately 37%. Graph 500 illustrates that a higher efficiency and a more rapid densification may be achieved by recirculating effluent gas as compared to increasing the virgin gas flow. Accordingly, the disclosed systems and methods of CVI/CVD may allow for faster densification of a carbon fiber preform and/or densification to greater than 1.7 g/cc. The disclosed systems and methods of CVI/CVD may allow for densification of a carbon fiber preform without machining steps to re-open closed surface pores. In this regard, the carbon fiber preform may be densified during a single CVI/CVD cycle.

Figure 5A:
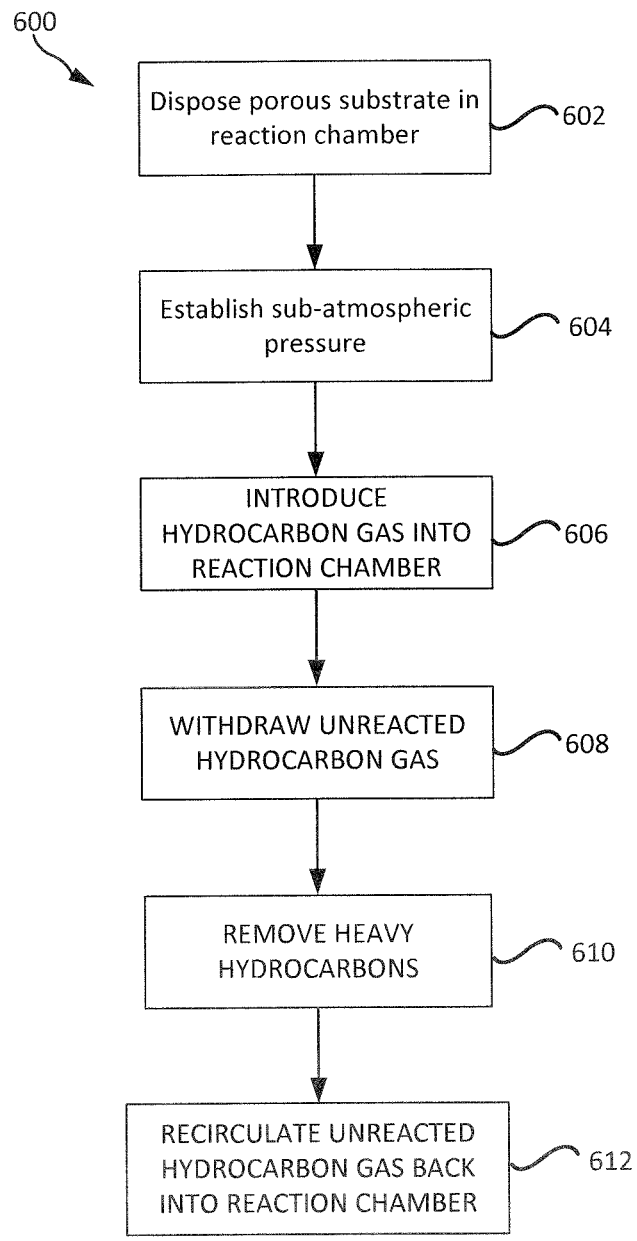
FIGS. 5A and 5B illustrate a method of chemical vapor infiltration and deposition.

Referring to FIG. 5A, a method 600 of CVI/CVD is illustrated in accordance with various embodiments. Method 600 may comprise disposing a porous substrate within a reaction chamber (step 602), establishing a sub-atmospheric pressure within the reaction chamber (step 604), introducing a hydrocarbon reaction gas into a reaction zone of the reaction chamber to densify the porous substrate (step 606), and withdrawing unreacted hydrocarbon reaction gas from the reaction chamber (step 608). In various embodiments, the unreacted hydrocarbon reaction may comprise hydrocarbon molecules having six or more carbon atoms. Method 600 may further comprise removing at least a portion of the hydrocarbon molecules having six or more carbon molecules from the unreacted hydrocarbon reaction gas by causing the portion of the hydrocarbon molecules having six or more carbon atoms to condense (step 610). In various embodiment, step 610 may comprise flowing the unreacted hydrocarbon reaction gas through a trap including one or more sets of rotating blades. Method 600 may further comprise recirculating at least a portion of the unreacted hydrocarbon reaction gas back into the reaction zone (step 612).

Figure 5B:
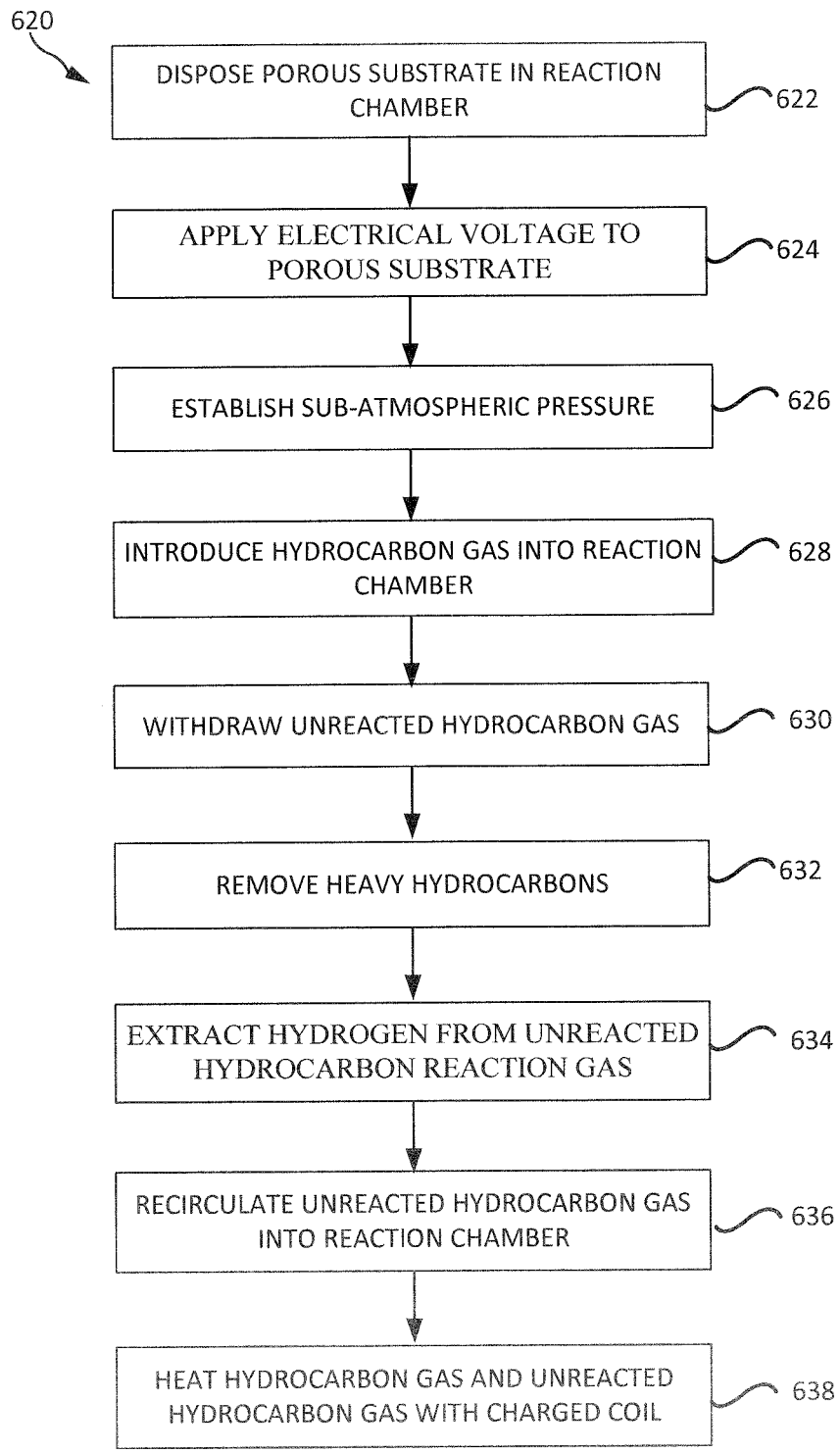

Referring to FIG. 5B, a method 620 of CVI/CVD is illustrated in accordance with various embodiments. Method 620 may comprise disposing a porous substrate within a reaction chamber (step 622), applying an electrical voltage to the porous substrate (step 624), and establishing a sub-atmospheric pressure within the reaction chamber (step 626). In various embodiments, step 626 may comprise inputting inert gas into the reaction chamber.

Method 620 may further comprise introducing a hydrocarbon reaction gas into a reaction zone of the reaction chamber to densify the porous substrate (step 628), and withdrawing unreacted hydrocarbon reaction gas from the reaction chamber (step 630). In various embodiments, the unreacted hydrocarbon reaction may comprise hydrocarbon molecules having six or more carbon atoms. Method 620 may further comprise removing at least a portion of the hydrocarbon molecules having six or more carbon molecules from the unreacted hydrocarbon reaction gas (step 632). In various embodiment, step 632 may comprise flowing the unreacted hydrocarbon reaction gas through a trap including one or more sets of rotating blades. In various embodiment, step 632 may comprise applying an electric arc to the unreacted hydrocarbon reaction gas withdrawn from the reaction chamber.

Method 620 may further comprise extracting hydrogen from the unreacted hydrocarbon reaction gas (step 634). In various embodiment, step 634 may comprise flowing the unreacted hydrocarbon reaction gas through at least one of a cryogenic-cooler or a pressure swing absorption unit. Method 620 may further comprise recirculating at least a portion of the unreacted hydrocarbon reaction gas back into the reaction zone (step 636), and heating at least one of the hydrocarbon reaction gas or the portion of the unreacted hydrocarbon reaction gas recirculated into the reaction zone using a charged coil located proximate an inlet of the reaction chamber (step 638). In various embodiments, the charged coil may provide an electrical conduction path to either charge or ground an interior wall of the reaction chamber.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure.

The scope of the disclosure is accordingly to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. All ranges and ratio limits disclosed herein may be combined.

Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

The steps recited in any of the method or process descriptions may be executed in any order and are not necessarily limited to the order presented. Furthermore, any reference to singular includes plural embodiments, and any reference to more than one component or step may include a singular embodiment or step. Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

Any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts or areas but not necessarily to denote the same or different materials. In some cases, reference coordinates may be specific to each figure.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of chemical vapor infiltration and deposition, comprising:
   disposing a porous substrate within a reaction chamber;
   establishing a sub-atmospheric pressure within the reaction chamber;
   introducing a hydrocarbon reaction gas into a reaction zone of the reaction chamber to densify the porous substrate;
   withdrawing unreacted hydrocarbon reaction gas from the reaction chamber, the unreacted hydrocarbon reaction gas comprising hydrocarbon molecules having six or more carbon atoms;
   removing at least a portion of the hydrocarbon molecules having six or more carbon molecules from the unreacted hydrocarbon reaction gas by causing the portion of the hydrocarbon molecules having six or more carbon atoms to condense; and
   recirculating at least a portion of the unreacted hydrocarbon reaction gas back into the reaction zone.

2. The method of claim 1, further comprising applying an electrical voltage to the porous substrate.

3. The method of claim 1, wherein removing the portion of the hydrocarbon molecules having six or more carbon molecules from the unreacted hydrocarbon reaction gas comprises flowing the unreacted hydrocarbon reaction gas through a trap including one or more sets of rotating blades.

4. The method of claim 1, further comprising extracting hydrogen from the unreacted hydrocarbon reaction gas.

5. The method of claim 4, wherein the extracting hydrogen comprises flowing the unreacted hydrocarbon reaction gas through at least one of a cryogenic-cooler or a pressure swing absorption unit.

6. The method of claim 1, further comprising applying an electric arc to the unreacted hydrocarbon reaction gas withdrawn from the reaction chamber.

7. The method according of claim 1, further comprising heating at least one of the hydrocarbon reaction gas or the portion of the unreacted hydrocarbon reaction gas recirculated into the reaction zone using a charged coil located proximate an inlet of the reaction chamber, wherein the charged coil provides an electrical conduction path to at least one of charge or ground an interior wall of the reaction chamber.

* * * * *